(12) United States Patent
Suzuki

(10) Patent No.: US 10,056,263 B2
(45) Date of Patent: Aug. 21, 2018

(54) METHOD OF PROCESSING SIC WAFER

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/485,987

(22) Filed: Apr. 12, 2017

(65) Prior Publication Data

US 2017/0301549 A1 Oct. 19, 2017

(30) Foreign Application Priority Data

Apr. 19, 2016 (JP) .................. 2016-083592

(51) Int. Cl.
| | |
|---|---|
| *H01L 21/302* | (2006.01) |
| *H01L 21/304* | (2006.01) |
| *H01L 21/268* | (2006.01) |
| *H01L 21/322* | (2006.01) |
| *H01L 29/16* | (2006.01) |
| *H01L 29/32* | (2006.01) |

(52) U.S. Cl.
CPC .......... *H01L 21/304* (2013.01); *H01L 21/268* (2013.01); *H01L 21/3043* (2013.01); *H01L 21/322* (2013.01); *H01L 29/1608* (2013.01); *H01L 29/32* (2013.01)

(58) Field of Classification Search
USPC ........................................................ 438/797
See application file for complete search history.

(56) References Cited

U.S. PATENT DOCUMENTS

| | | | | |
|---|---|---|---|---|
| 7,998,836 B1* | 8/2011 | Shiomi | ............ | H01L 29/66204 257/E33.025 |
| 2005/0260829 A1* | 11/2005 | Uematsu | ............... | H01L 21/304 438/460 |
| 2014/0334511 A1* | 11/2014 | Takeda | ..................... | H01S 3/10 372/41 |

FOREIGN PATENT DOCUMENTS

JP 2007-019379 1/2007

* cited by examiner

*Primary Examiner* — Timor Karimy
(74) *Attorney, Agent, or Firm* — Greer Burns & Crain, Ltd.

(57) ABSTRACT

A SiC wafer is processed by a laser beam having a wavelength that transmits SiC to form a peeling plane in a region of the wafer which corresponds to a device area of a first surface of the wafer. A plurality of devices demarcated by a plurality of intersecting projected dicing lines in the device area are formed on the first surface. An annular groove is formed on a second surface of the wafer which is opposite the first surface, in a boundary region of the wafer between the device area and an outer peripheral excessive area surrounding the device area. A portion of the wafer which is positioned radially inwardly of the annular groove is peeled from the peeling plane, thereby thinning the device area and forming an annular stiffener area on a region of the second surface which corresponds to the outer peripheral excessive area.

5 Claims, 8 Drawing Sheets

METHOD OF PROCESSING SIC WAFER

BACKGROUND OF THE INVENTION

Field of the Invention

The present invention relates to a method of processing a silicon carbide (SiC) wafer having a first surface and a second surface which is opposite the first surface, the first surface including a device area where a plurality of devices are formed and an outer peripheral excessive area surrounding the device area.

Description of the Related Art

Devices such as integrated circuits (ICs) and large scale integration (LSI) circuits, etc. are produced by depositing functional layers on the face side of an Si wafer made of Si (silicon) and demarcating the functional layers along projected dicing lines. The reverse side of the Si wafer includes an area corresponding to a device area on the face side where devices are formed. The area on the reverse side of the Si wafer is ground by a grinding apparatus having a rotatable grinding wheel on which grinding stones are arranged in an annular array, thereby thinning the device area to a predetermined thickness and forming an annular stiffener area on the reverse side which corresponds to an outer peripheral excessive area on the face side that surrounds the device area. Then, the Si wafer is divided along the projected dicing lines into individual devices by a cutting apparatus or a laser processing apparatus. The devices will be used in various electric appliances such as mobile phones, personal computers, etc. (see Japanese Patent Laid-open No. 2007-19379).

Power devices or devices such as light emitting diodes (LEDs), etc. are produced by depositing functional layers on the upper surface of an SiC wafer made of SiC and demarcating the functional layers along projected dicing lines. The reverse side of the SiC wafer includes an area corresponding to a device area on the face side where devices are formed. The area on the reverse side of the SiC wafer is also ground by the grinding apparatus referred to above, thereby thinning the device area to a predetermined thickness and forming an annular stiffener area on the reverse side which corresponds to an outer peripheral excessive area on the face side that surrounds the device area. Thereafter, sub-devices such as electrodes, etc. are formed in areas on the reverse side which correspond to the respective devices. The SiC wafer is then divided along the projected dicing lines into individual devices by a cutting apparatus or a laser processing apparatus. The devices will be used in various electric appliances such as mobile phones, personal computers, control devices for an automobile, etc.

SUMMARY OF THE INVENTION

SiC has a very high Mohs hardness compared with Si and hence poses a problem in that when a grinding wheel grinds the reverse side of an SiC wafer, the grinding wheel is likely to be worn to a large extent, e.g., approximately four or five times more than the extent to which the SiC wafer is ground thereby. Therefore, it's not economical. Specifically, if a grinding wheel grinds an SiC wafer by a thickness of approximately 100 μm, then the grinding wheel is worn by a thickness of approximately 400 to 500 μm. On the other hand, if a grinding wheel grinds an Si wafer by a thickness of approximately 100 μm, then the grinding wheel is worn by a thickness of approximately 0.1 μm. Therefore, when a grinding wheel grinds an SiC wafer, the grinding wheel is worn by approximately 4000 to 5000 times more than it is when it grinds an Si wafer.

It is an object of the present invention to provide a method of processing an SiC wafer in a manner to reduce the amount by which a grinding wheel is worn when it grinds the SiC wafer.

In accordance with an aspect of the present invention, there is provided a method of processing an SiC wafer having a first surface and a second surface which is opposite the first surface, the first surface including a device area where a plurality of devices are formed and an outer peripheral excessive area surrounding the device area. The method includes: a peeling plane forming step of positioning, in a region of the SiC wafer which corresponds to the device area, the focused point of a pulsed laser beam to be applied at a depth corresponding to a finished thickness of the SiC wafer as viewed from the first surface thereof, and, while moving the SiC wafer and the focused point relatively to each other, irradiating the SiC wafer with the laser beam having a wavelength that transmits SiC, from the first surface or the second surface, thereby forming a plurality of straight reduced strength areas each including a modified layer and cracks in the region of the SiC wafer which corresponds to the device area, at the depth corresponding to the finished thickness of the SiC wafer as viewed from the first surface thereof, thereby forming a peeling plane jointly made up of said straight reduced strength areas; a device forming step of forming a plurality of devices demarcated by a plurality of intersecting projected dicing lines in the device area after performing the peeling plane forming step; an annular groove forming step of forming an annular groove in a region of the SiC wafer which corresponds to a boundary region between the device area and the outer peripheral excessive area, from the second surface, leaving a layer having a thickness which corresponds to the finished thickness of the SiC wafer, near the first surface after performing the device forming step; a thinning step of peeling off a portion of the SiC wafer positioned next the second surface radially inwardly of said annular groove from said peeling plane that serves as a boundary face, thereby thinning the device area of the SiC wafer and forming an annular stiffener area on a region of the second surface which corresponds to the outer peripheral excessive area after performing the annular groove forming step; and a planarizing step of grinding the peeling plane of the SiC wafer which is surrounded by said annular stiffener areas, thereby planarizing the peeling plane after performing the thinning step.

Preferably, the method further includes a step of forming sub-devices in areas of the planarized peeling plane which correspond to the respective devices after performing the planarizing step. Preferably, the SiC wafer has a c-axis inclined with respect to a vertical axis which extends perpendicularly to the first surface. The peeling plane forming step includes: a reduced strength area forming step of, while moving the SiC wafer and the focused point relatively to each other in a direction perpendicular to the direction in which the c-axis is inclined, irradiating the SiC wafer with the laser beam having the wavelength that transmits SiC, thereby forming the straight reduced strength areas each including the modified layer and the cracks which extend from the modified layer along a c-plane of the SiC wafer; and an indexing step of indexing-feeding the SiC wafer and the focused point relatively to each other by a predetermined distance in the direction in which the c-axis is inclined.

In the method of processing a SiC wafer according to the present invention, a portion of the SiC wafer positioned radially inwardly of the annular groove is peeled off from the peeling plane that serves as a boundary face, thereby thinning the device area of the SiC wafer. Accordingly, the SiC wafer can be thinned without being ground. Furthermore, the peeling plane of the SiC wafer which is surrounded by the annular stiffener area can be planarized with a much less amount of wafer material ground off than if the SiC wafer were thinned only by being ground, so that the amount of material worn off grinding stones used to grind the peeling plane can be greatly reduced. Moreover, as the devices are formed after the peeling plane has been formed, the devices are not in danger of being damaged by the application of a laser beam.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
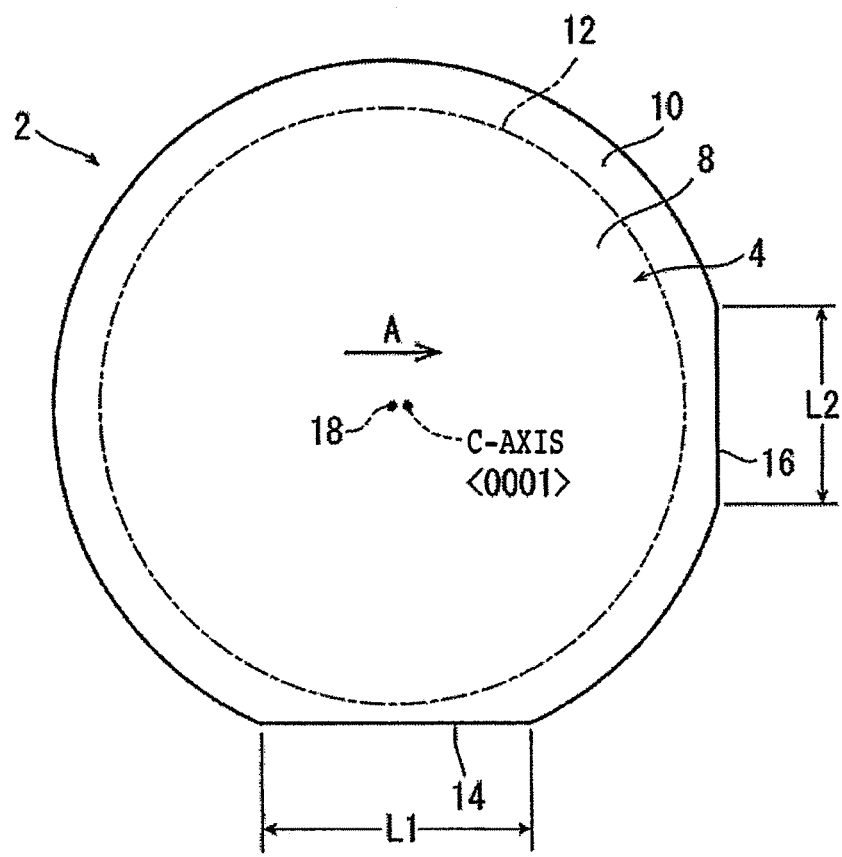
FIG. 1A is a plan view of an SiC wafer.
Figure 1B:
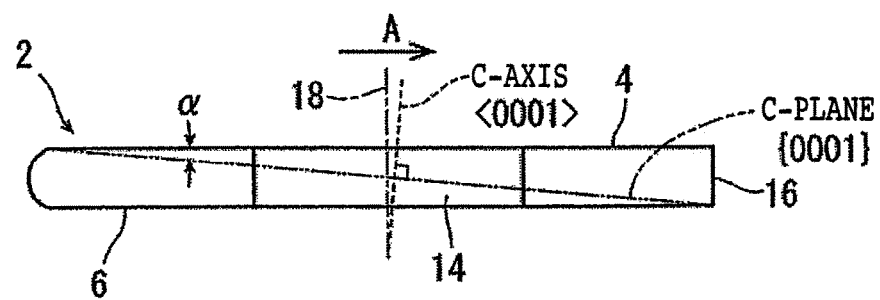
FIG. 1B is a front elevational view of the SiC wafer.

A method of processing an SiC wafer according to the present invention will be described below with reference to the drawings. FIGS. 1A and 1B show a disk-shaped hexagonal single-crystal SiC wafer 2 (hereinafter referred to as "wafer 2") having a thickness of 700 μm and a first surface 4 and a second surface 6 which is opposite the first surface 4. The first surface 4 includes a circular device area 8 where a plurality of devices are to be formed and an annular outer peripheral excessive area 10 surrounding the device area 8. In FIG. 1A, a boundary region 12 between the device area 8 and the outer peripheral excessive area 10 is indicated by the dot-and-dash line for illustrative purposes. Actually, there is no such a line indicating the boundary region 12 on the wafer 2. The wafer 2 also has on its peripheral edge a first orientation flat 14 and a second orientation flat 16 which indicate crystal orientations. The length L2 of the second orientation flat 16 is smaller than the length L1 of the first orientation flat 14 (L2<L1). The first orientation flat 14 and the second orientation flat 16 are perpendicular to each other. The wafer 2 has a central vertical axis 18 which extends perpendicularly to the first surface 4. The wafer 2 also has a c-axis (<0001> direction) inclined with respect to the vertical axis 18 toward the second orientation flat 16 (the direction in which the c-axis is inclined is indicated by the arrow A), and an off-angle α formed between a c-plane ({0001} plane) perpendicular to the c-axis and the first surface 4, opposite to the second orientation flat 16.

Figure 2:
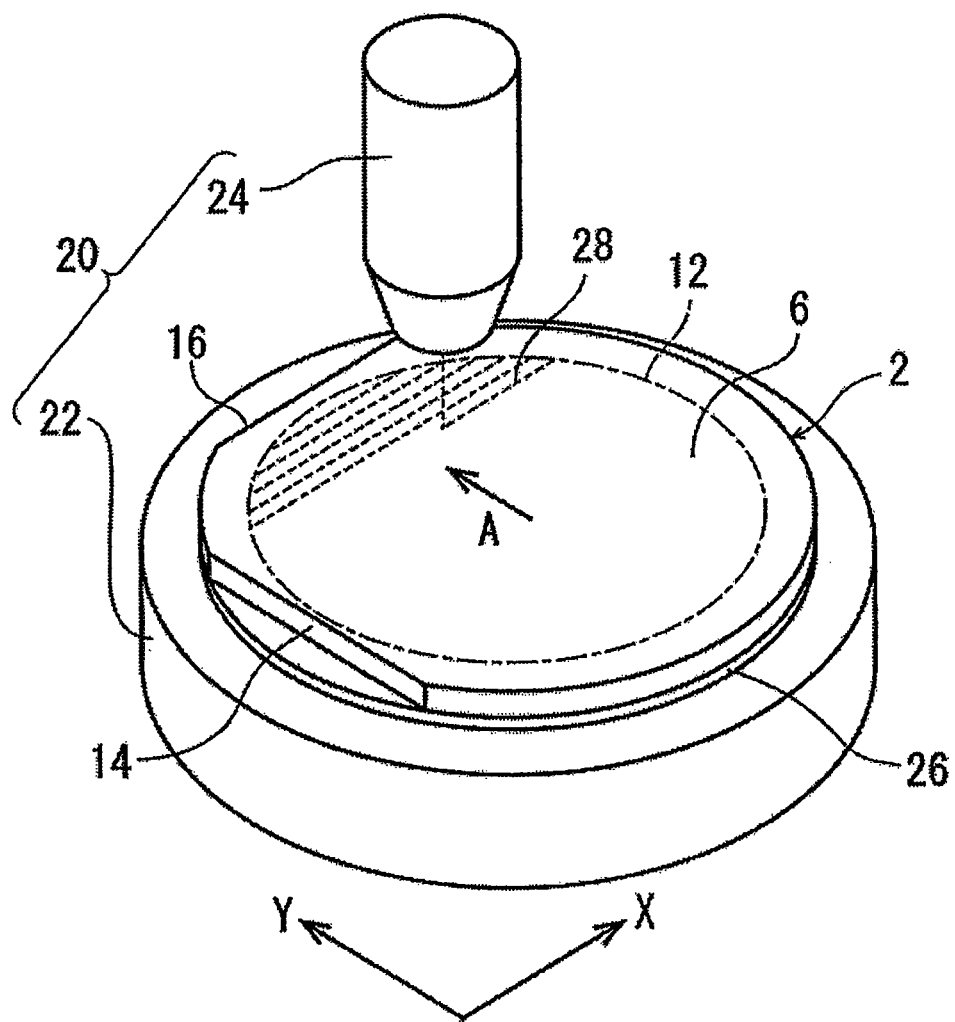
FIG. 2 is a perspective view showing the manner in which a peeling plane forming step is carried out on the SiC wafer.

In the method of processing an SiC wafer according to the present invention, a peeling plane forming step is initially carried out on the wafer 2. The peeling plane forming step is performed using a laser processing apparatus 20, part of which is shown in FIG. 2. The laser processing apparatus 20 includes a chuck table 22 and a beam condenser 24. The chuck table 22 is arranged to attract a workpiece, typically the wafer 2, under suction on its upper surface. The chuck table 22 is rotatable around a vertical axis thereof by rotating means (not shown), movable in the X directions by X-direction moving means (not shown), and movable in the Y directions by Y-direction moving means (not shown). The beam condenser 24 has a condensing lens (not shown) for converging a pulsed laser beam emitted from a pulsed laser beam oscillator (not shown) of the laser processing apparatus 20 and applying the converged pulsed laser beam to the workpiece held on the chuck table 22. The X directions refer to directions indicated by the arrow X in FIG. 2, and the Y directions refer to directions indicated by the arrow Y in FIG. 2 and are perpendicular to the X directions. The X and Y directions jointly define a plane which is essentially a horizontal plane.

Figure 3A:
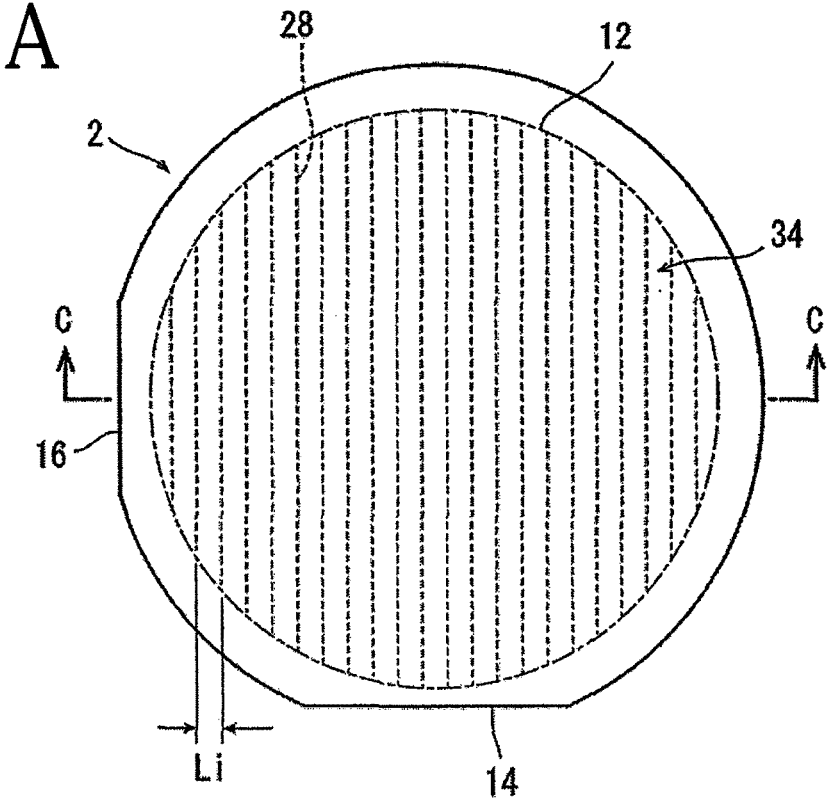
FIG. 3A is a plan view of the SiC wafer in which a peeling plane has been formed.
Figure 3B:
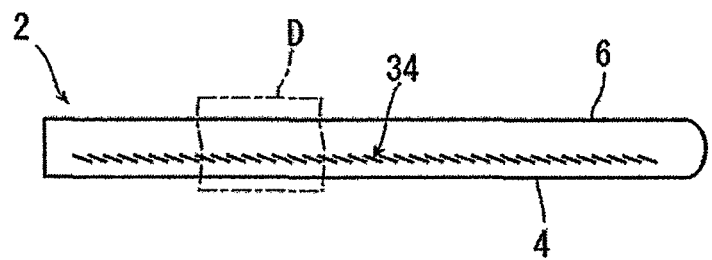
FIG. 3B is a cross-sectional view taken along line C-C of FIG. 3A.
Figure 3C:
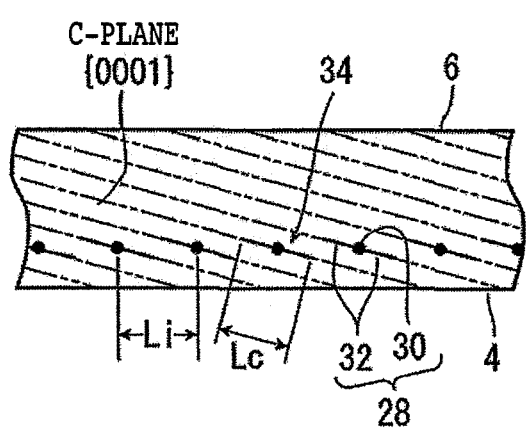
FIG. 3C is an enlarged fragmentary cross-sectional view of a section D shown in FIG. 3B.

In the peeling plane forming step, a protective member 26 is applied to the first surface 4 of the wafer 2. Then, the wafer 2 is attracted under suction on the upper surface of the chuck table 22 with the first surface 4, to which the protective member 26 has been applied, facing downwardly. Then, the X-direction moving means, the Y-direction moving means, and the rotating means are actuated to move and rotate the chuck table 22 to align the second orientation flat 16 with the X directions and to position the wafer 2 and the beam condenser 24 into alignment with each other. Generally, the second orientation flat 16 is formed perpendicularly to the direction A in which the c-axis is inclined. Therefore, when the second orientation flat 16 is aligned with the X directions, the direction A in which the c-axis is inclined is made perpendicular to the X directions and aligned with the Y directions. Then, in a region within the wafer 2 which corresponds to the device area 8, the focused point of a pulsed laser beam to be emitted from the beam condenser 24 is positioned at a depth corresponding to a finished thickness of the wafer 2 as viewed from the first surface 4 in the device area 8. Then, a reduced strength area forming step is carried on the wafer 2. In the reduced strength area forming step, as shown in FIG. 2, while the chuck table 22 is being moved in one of the X directions, i.e., a direction perpendicular to the direction A in which the c-axis is inclined, at a predetermined processing feed speed by the X-direction moving means, the beam condenser 24 irradiates the wafer 2 with a pulsed laser beam having a wavelength that transmits SiC, from the second surface 6, thereby forming a straight reduced strength area 28 (see FIGS. 3A and 3C) in the region within the wafer 2 which corresponds to the device area 8. The reduced strength area forming step is then followed by an indexing step. In the indexing step, the chuck table 22 is indexing-fed a predetermined distance in one of the Y directions, i.e., the direction A in which the c-axis is inclined, by the Y-direction moving means. Thereafter, the reduced strength area forming step and the indexing step are alternately carried out repeatedly, thereby forming, in the wafer 2, a plurality of parallel straight reduced strength areas 28 spaced at predetermined distances along the direction A in which the c-axis is inclined, as shown in FIG. 3A. The straight reduced strength areas 28 jointly make up a peeling plane 34 in the region within the wafer 2 which corresponds to the device area 8 at the depth corresponding to the finished thickness of the wafer 2 as viewed from the first surface 4. The peeling plane forming step can be carried out under the following processing conditions:

Laser beam wavelength: 1064 nm
Repetitive frequency: 80 kHz
Average output power: 3.2 W
Pulse duration: 4 ns
Focused spot diameter: 10 µm
Numerical aperture of condensing lens (NA): 0.45
Indexed distance: 500 µm As shown in FIG. 3C, each of the straight reduced strength areas 28 includes a modified layer 30, which is a region where Si and C are separate from each other, and cracks 32. Since the straight reduced strength areas 28 are perpendicular to the direction A in which the c-axis is inclined and formed at the same depth, the modified layers 30 of the straight reduced strength areas 28 are positioned at the same c-plane. When the modified layer 30 is formed, the cracks 32 are propagated from the modified layer 30 along the c-plane on both sides of the modified layer 30. The length of the crack 32 propagated on one side of each modified layer 30 is approximately 250 µm, and hence the length Lc of the cracks 32 on both sides of the modified layer 30 is approximately 500 µm. Therefore, when the indexed distance Li in the Y directions is approximately 500 µm as described above in the peeling plane forming step, a peeling plane 34 that is made up of the modified layers 30 and the cracks 32 is formed in the wafer 2 at a depth corresponding to the finished thickness of the wafer 2 as viewed from the first surface 4.

Figure 4:
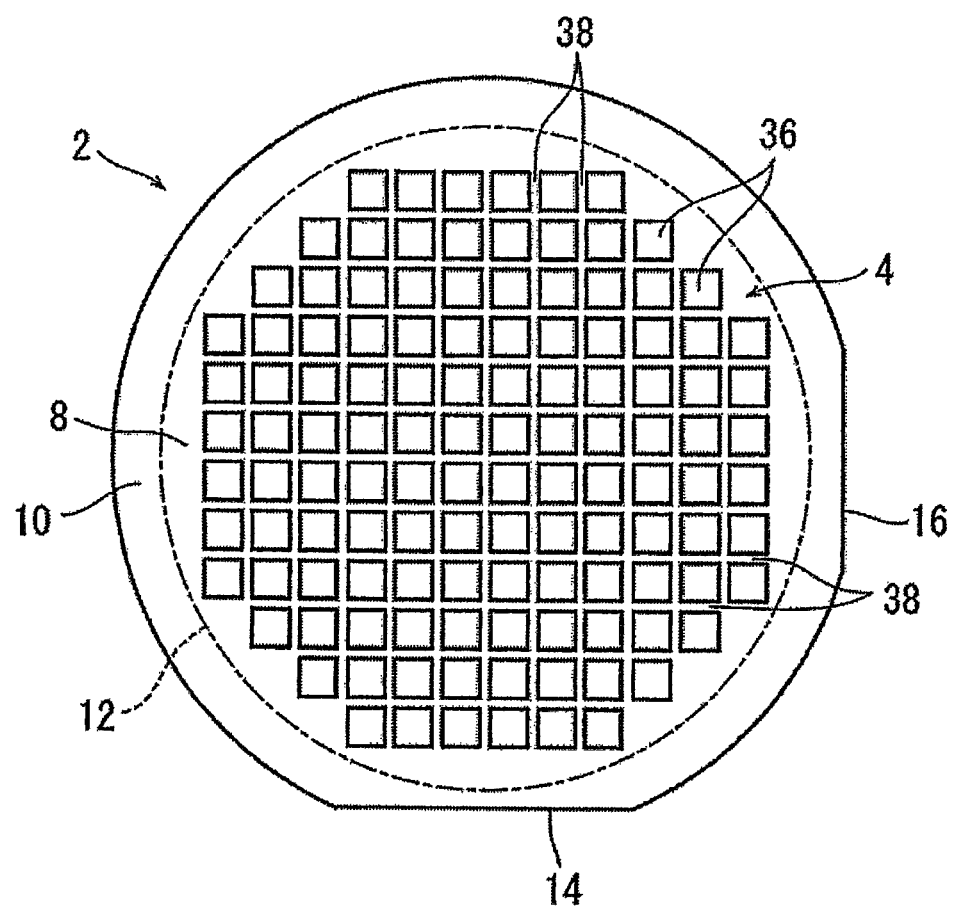
FIG. 4 is a plan view of the SiC wafer on which devices have been formed.

The peeling plane forming step is followed by a device forming step. In the device forming step, first, the protective member 26 is peeled off the first surface 4. Then, functional layers are deposited on the device area 8 of the first surface 4, forming a plurality of devices 36 thereon. As shown in FIG. 4, the devices 36 are demarcated by a grid of intersecting projected dicing lines 38. In the method of processing an SiC wafer according to the present invention, since the device forming step is carried out after the peeling plane forming step, the devices 36 are not in danger of being damaged by the application of a laser beam.

Figure 5:
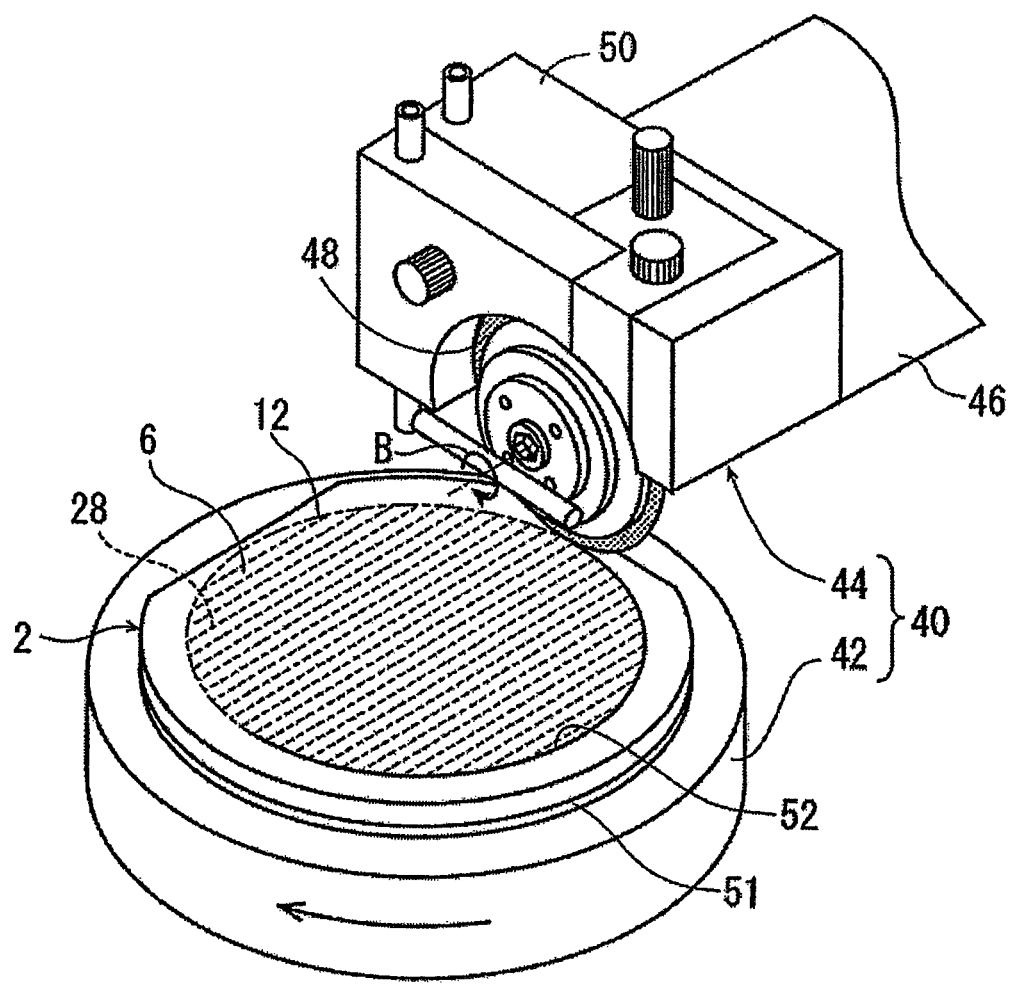
FIG. 5 is a perspective view showing the manner in which an annular groove forming step is carried out on the SiC wafer.

Then, an annular groove forming step is carried out following the device forming step. The annular groove forming step may be carried out using a cutting apparatus 40, part of which is shown in FIG. 5. The cutting apparatus 40 includes a chuck table 42 and cutting means 44. The chuck table 42, which is arranged to attract a workpiece, typically the wafer 2, under suction on its upper surface, is rotatable around a vertical axis thereof by rotating means (not shown). The cutting means 44 includes a hollow cylindrical spindle housing 46 extending substantially horizontally and a cylindrical spindle (not shown) housed in the spindle housing 46 and rotatable around a substantially horizontal axis thereof. The spindle has a proximal end coupled to a motor (not shown) and a distal end to which an annular cutting blade 48 is fixed. The cutting blade 48 has an upper portion covered with a blade cover 50.

Figure 6A:
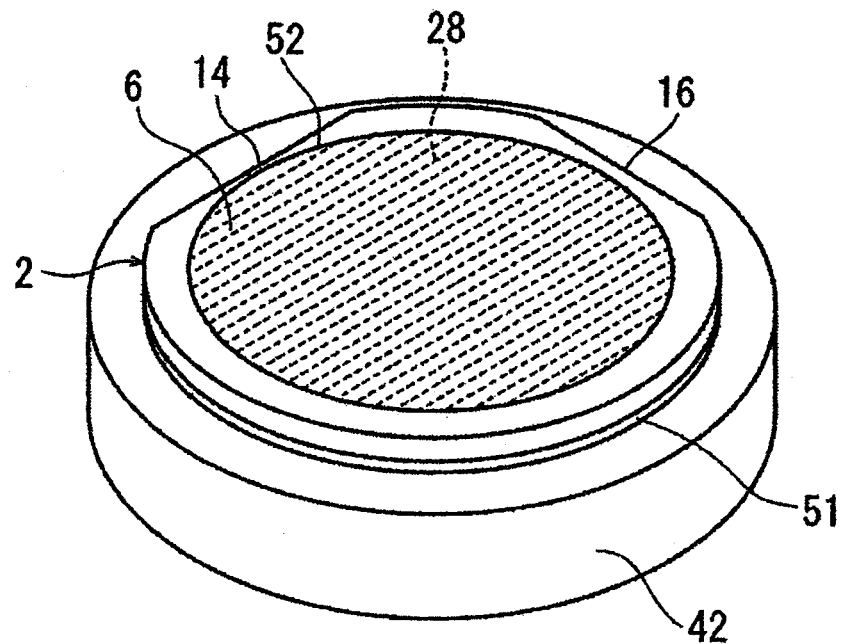
FIG. 6A is a perspective view of the SiC wafer with an annular groove formed therein.
Figure 6B:
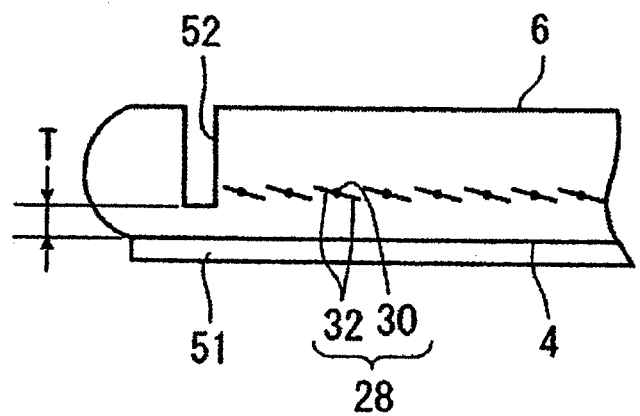
FIG. 6B is an enlarged fragmentary cross-sectional view of a portion of the SiC wafer shown in FIG. 6A.

In the annular groove forming step, initially, a protective member 51 is applied to the first surface 4 of the wafer 2 on which the devices 36 have been formed. Then, the wafer 2 is attracted under suction on the upper surface of the chuck table 42 with the first surface 4, to which the protective member 51 has been applied, facing downwardly. Then, the spindle and hence the cutting blade 48 are rotated in the direction indicated by the arrow B in FIG. 5 by the motor. The chuck table 42 is rotated clockwise as viewed from above by the rotating means. Thereafter, the spindle housing 46 is lowered by vertically moving means (not shown), causing the cutting edge of the cutting blade 48 to cut, from the second surface 6, into the region of the wafer 2 which corresponds to the boundary region 12 between the device area 8 and the outer peripheral excessive area 10 on the first surface 4. Consequently, as shown in FIGS. 5, 6A, and 6B, an annular groove 52 is formed in a region of the wafer 2 which corresponds to the boundary region 12 between the device area 8 and the outer peripheral excessive area 10. According to the present embodiment, as shown in FIG. 6B, the annular groove 52 vertically terminates short of the first surface 4, leaving a wafer layer having a thickness T of 50 µm, for example, which corresponds to the finished thickness of the wafer 2, near the first surface 4.

Figure 7A:
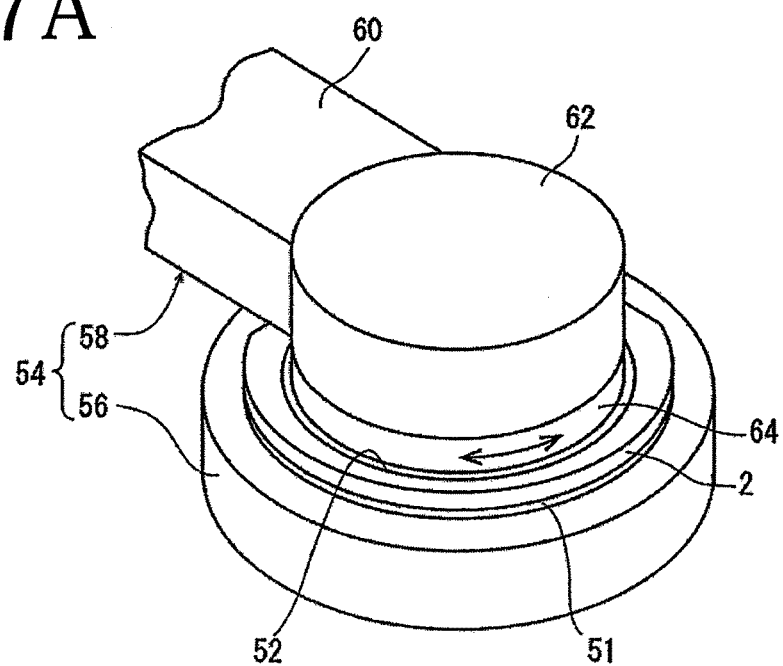
FIGS. 7A and 7B are perspective views showing the manner in which a thinning step is carried out on the SiC wafer.
Figure 7B:
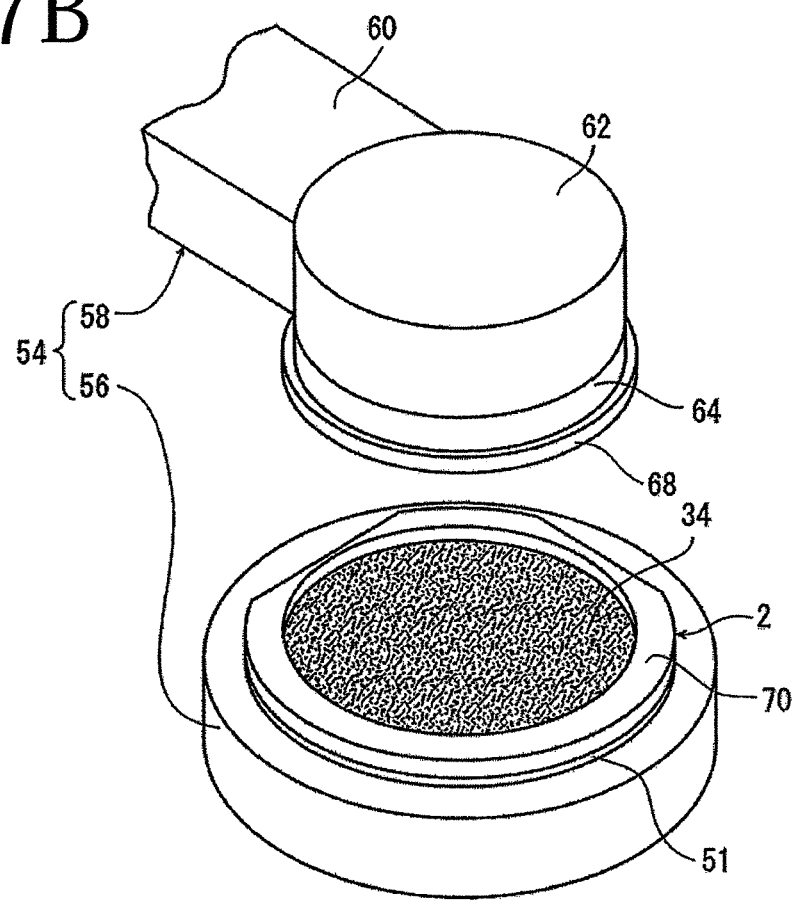

The annular groove forming step is followed by a thinning step. The thinning step can be carried out using a peeling apparatus 54, part of which is shown in FIGS. 7A and 7B. The peeling apparatus 54 includes a chuck table 56 and peeling means 58. The chuck table 56 is arranged to attract a workpiece, typically the wafer 2, under suction on its upper surface. The peeling means 58 includes an arm 60 extending substantially horizontally and a motor 62 mounted on the distal end of the arm 60. A disk-shaped suction member 64 is coupled to the lower surface of the motor 62 for rotation around a vertical axis. The suction member 64 houses therein ultrasonic vibration applying means (not shown) for applying ultrasonic vibrations to the lower surface of the suction member 64.

In the thinning step, the wafer 2 is attracted under suction on the upper surface of the chuck table 56 with the first surface 4, to which the protective member 51 has been applied, facing downwardly. Then, the arm 60 is lowered by vertically moving means (not shown), and the second surface 6 of the wafer 2, which lies radially inwardly of the annular groove 52, is attracted to the suction member 64 under suction. Thereafter, the ultrasonic vibration applying means is actuated to apply ultrasonic vibrations to the lower surface of the suction member 64, and the motor 62 is energized to rotate the suction member 64 around its own axis. At this time, a portion 68 of the wafer 2 positioned next the second surface 6 radially inwardly of the annular groove 52 and attracted to the suction member 64 is peeled off from the peeling plane 34 that serves as a boundary face, thereby thinning the device area 8 of the wafer 2 and forming an annular stiffener area 70 on a region of the second surface 6 which corresponds to the outer peripheral excessive area 10. Accordingly, the wafer 2 can be thinned without being ground.

Figure 8:
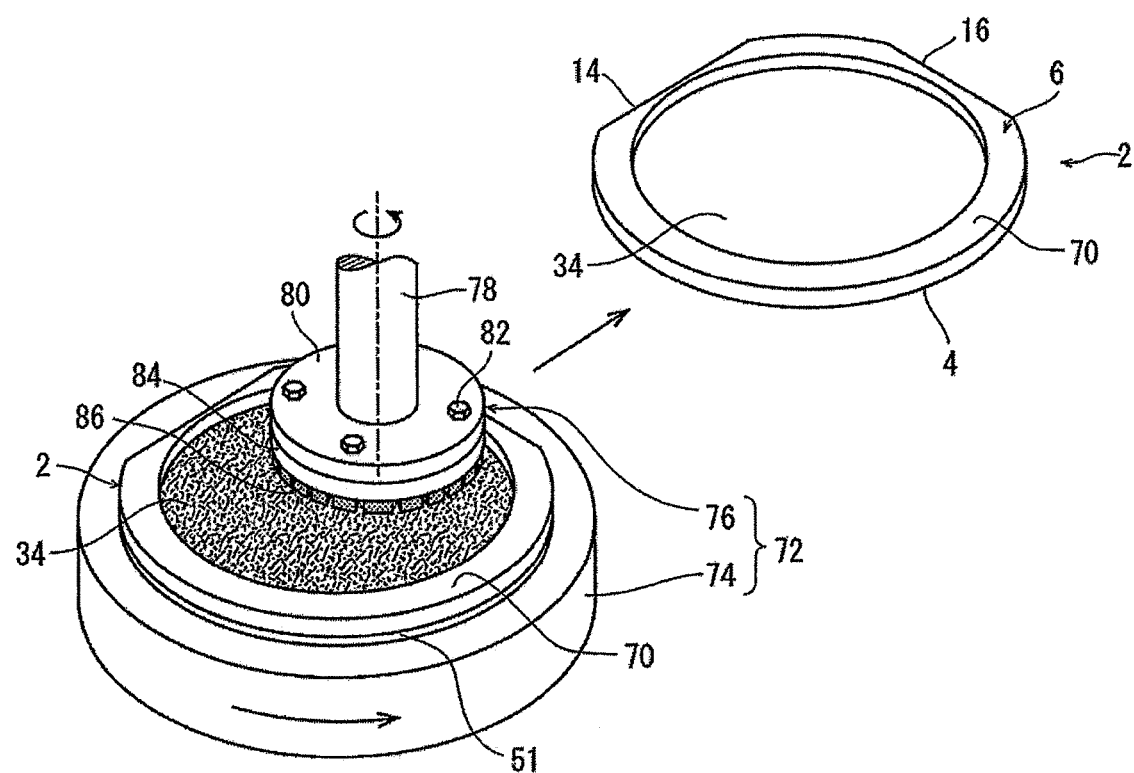
FIG. 8 is a perspective view showing the manner in which a planarizing step is carried out on the SiC wafer.

Then, a planarizing step is carried out after the thinning step. The planarizing step can be performed using a grinding apparatus 72, part of which is shown in FIG. 8. The grinding apparatus 72 includes a chuck table 74 and grinding means 76. The chuck table 74, which is arranged to attract a workpiece, typically the wafer 2, under suction on its upper surface, is rotatable around a vertical axis thereof by rotating means (not shown). The grinding means 76 includes a vertical cylindrical spindle 78 coupled to a motor (not shown) and a disk-shaped wheel mount 80 fixed to the lower end of the spindle 78. An annular grinding wheel 84 is fixed to the lower surface of the wheel mount 80 by bolts 82. A plurality of grinding stones 86 that are arranged in an annular array and spaced circumferentially at intervals are fixed to the lower surface of the annular grinding wheel 84. As shown in FIG. 8, the spindle 78 and hence the grinding wheel 84 are rotatable around a vertical axis which is displaced radially off the vertical axis around which the chuck table 74 is rotatable. The annular array of the grinding stones 86 defines a circle whose diameter is essentially the same as the radius of the device area 8 of the wafer 2.

In the planarizing step, the wafer 2 with the peeling plane 34 exposed upwardly and surrounded by the annular stiffener area 70 is attracted under suction on the upper surface of the chuck table 74 with the first surface 4, to which the protective member 51 has been applied, facing downwardly. Then, the spindle 78 is rotated counterclockwise as viewed from above at a predetermined speed of 6000 rpm, for example, by the motor. The chuck table 74 is rotated counterclockwise as viewed from above at a predetermined speed of 300 rpm, for example, by the rotating means. Then, the spindle 78 is lowered by vertically moving means (not shown), bringing the grinding stones 86 into contact with the peeling plane 34 of the wafer 2. After bringing the grinding stones 86 into contact with the peeling plane 34, the vertically moving means lowers the spindle 78 at a predetermined grinding rate of 0.1 μm/second, for example, thereby planarizing the peeling plane 34. The peeling plane 34 can be ground to a desired flat surface when it is ground by a depth in the range from approximately 1 to 5 μm, and the grinding stones 86 are worn by a thickness in the range from approximately 4 to 25 μm by thus grinding the peeling plane 34. If a wafer 2 having a thickness of 700 μm were thinned to a thickness of 50 μm only by being ground by the grinding stones 86, then the grinding stones 86 would be worn by a thickness in the range from approximately 2.6 to 3.3 mm. According to the present embodiment, therefore, the peeling plane 34 of the wafer 2 can be planarized with a much less amount of wafer material ground off than if the wafer 2 were thinned only by being ground, so that the amount of material worn off the grinding stones 86 can be greatly reduced. After the planarizing step, sub-devices such as electrodes, etc. are formed in areas of the planarized peeling plane 34 which correspond to the respective devices 36.

According to the illustrated embodiment described above, the beam condenser 24 irradiates the wafer 2 with the pulsed laser beam from the second surface 6 of the wafer 2 in the peeling plane forming step. However, the beam condenser 24 may irradiate the wafer 2 with the pulsed laser beam from the first surface 4 of the wafer 2 in the peeling plane forming step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing an SiC wafer having a first surface and a second surface which is opposite the first surface, the first surface including a device area where a plurality of devices are formed and an outer peripheral excessive area surrounding the device area, the method comprising:

a peeling plane forming step of positioning, in a region of the SiC wafer which corresponds to the device area, a focused point of a pulsed laser beam to be applied at a depth corresponding to a finished thickness of the device area of the SiC wafer as viewed from the first surface thereof, and, while moving the SiC wafer relative to the focused point, irradiating the SiC wafer with the laser beam having a wavelength, that transmits through the SiC wafer, from the first surface or the second surface, thereby forming a plurality of straight reduced strength areas each including a modified layer and cracks in the region of the SiC wafer which corresponds to the device area, at the depth corresponding to the finished thickness of the device area of the SiC wafer as viewed from the first surface thereof, thereby forming a peeling plane jointly made up of said straight reduced strength areas;

a device forming step of forming a plurality of devices demarcated by a plurality of intersecting projected dicing lines in the device area after performing the peeling plane forming step;

an annular groove forming step of forming an annular groove in a region of the SiC wafer which corresponds to a boundary region between the device area and the outer peripheral excessive area, from the second surface, leaving a layer having a thickness which corresponds to the finished thickness of the SiC wafer, near the first surface after performing the device forming step;

a thinning step of peeling off a portion of the SiC wafer positioned next to the second surface radially inwardly of said annular groove from said peeling plane that serves as a boundary face, thereby thinning the device area of the SiC wafer to the finished thickness and forming an annular stiffener area on a region of the second surface which corresponds to the outer peripheral excessive area after performing the annular groove forming step; and a planarizing step of grinding the peeling plane of the SiC wafer which is surrounded by said annular stiffener areas, thereby planarizing the peeling plane after performing the thinning step.

2. The method of processing an SiC wafer according to claim 1, further comprising:

a step of forming sub-devices in areas of the planarized peeling plane which correspond to the respective devices after performing the planarizing step.

3. The method of processing an SiC wafer according to claim 1, wherein the SiC wafer has a c-axis inclined with respect to a vertical axis which extends perpendicularly to the first surface, and wherein the peeling plane forming step includes:

a reduced strength area forming step of, while moving the SiC wafer relative to the focused point in a direction perpendicular to the direction in which the c-axis is inclined, irradiating the SiC wafer with the laser beam having a wavelength, that transmits through SiC, thereby forming the straight reduced strength areas each including the modified layer and the cracks which extend from the modified layer along a c-plane of the SiC wafer; and an indexing step of indexing-feeding the SiC wafer relative to the focused point by a predetermined distance in the direction in which the c-axis is inclined.

4. The method of processing an SiC wafer according to claim 1, wherein the thinning step comprises peeling off a portion of the SiC wafer through ultrasonic vibrations of a surface of a rotatable suction member in contact with one of said first or second surfaces of the SiC wafer.

5. The method of processing an SiC wafer according to claim 1, wherein the thinning step comprises peeling off a portion of the SiC wafer through rotation of a surface of a rotatable suction member in contact with one of said first or second surfaces of the SiC wafer.

* * * * *